(12) United States Patent
Ackerman et al.

(10) Patent No.: US 6,542,224 B2
(45) Date of Patent: *Apr. 1, 2003

(54) SILICA-BASED LIGHT-WEIGHT EUV LITHOGRAPHY STAGES

(75) Inventors: Bradford G. Ackerman, Scurry, TX (US); Bradley F. Bowden, Alfred, NY (US); Claude L. Davis, Jr., Painted Post, NY (US); Kenneth E. Hrdina, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/943,466

(22) Filed: Aug. 30, 2001

(65) Prior Publication Data

US 2002/0044267 A1 Apr. 18, 2002

Related U.S. Application Data

(60) Provisional application No. 60/240,005, filed on Oct. 13, 2000.

(51) Int. Cl.$^7$ .................. G03B 27/58; G03B 27/42; G03B 27/62
(52) U.S. Cl. ................. 355/72; 355/53; 355/75
(58) Field of Search ............... 355/72, 53, 57, 355/75; 378/34; 430/5; 438/455

(56) References Cited

U.S. PATENT DOCUMENTS 5,780,187 A * 7/1998 Pierrat .................. 430/324
6,368,942 B1 * 4/2002 Cardinale ............... 378/35

* cited by examiner

Primary Examiner—Russell Adams
Assistant Examiner—Peter B. Kim
(74) Attorney, Agent, or Firm—Edward F. Murphy

(57) ABSTRACT

A lithographic stage includes a platen having a top face and a bottom face and a holder for holding an optical component on the top face of the platen. The platen is made of a light-weight material such as high purity fused silica or ultra low expansion glass. The bottom face of the platen may further include means for connecting to a positioning device in an extreme ultraviolet lithography system.

13 Claims, 4 Drawing Sheets

SILICA-BASED LIGHT-WEIGHT EUV LITHOGRAPHY STAGES

RELATED APPLICATION

This Application claims priority of provisional U.S. application Ser. No. 60/240,005, filed on Oct. 13, 2000, and entitled "Silica-Based Light-weight EUVL Stages."

FIELD OF THE INVENTION

The present invention relates to extreme ultraviolet lithography (EUVL). More particularly, it relates to EUVL apparatus made of silica-based light-weight material.

BACKGROUND OF THE INVENTION

Extreme ultraviolet (EUV) lithography (EUVL) is a relatively new form of lithography. EUVL uses extreme ultraviolet (EUV, also called soft X-ray) radiation with a wavelength in the range of 10 to 14 nanometers (nm) to perform the imaging. Up to now, optical lithography has been the lithographic technique of choice in the high-volume manufacture of integrated circuits (IC). The constant improvement in optical lithography has allowed it to remain the semiconductor industry's workhorse through the 100 nm or smaller generation of devices. However, to pack even higher density circuits into IC chips, new technologies (Next-Generation Lithographies, NGL) will be required. EUVL is one NGL technology vying to become the successor to optical lithography.

In many respects, EUVL is similar to the optical lithography. For example, as illustrated in FIG. 1, the basic optical design for an EUVL system is similar to that of an optical lithographic system. It comprises a light source 1 of light 12, a condenser 2, a mask (reticle) 4 on a mask stage 5, an optical system 6, and a wafer 7 on a wafer stage 8. Both EUV and optical lithographies use optical systems (cameras) to project images on the masks onto substrates which comprise silicon wafers coated with photo resists. However, the apparent similarity stops here. Because EUV is strongly absorbed by virtually all materials, EUV imaging must be performed in vacuum, which is achieved by enclosing the system in a chamber 3. In addition, the chamber 3 might be further partitioned into different compartments 10 and 20, which have their own vacuum systems. Because EUV is absorbed by most materials, there are no suitable lenses to focus and project an image on mask 4 onto a substrate (wafer) 7. As a result, it is necessary to operate EUVL in a reflective mode instead of a transmissive mode. In the reflective mode, light is reflected from mirrors (not shown; inside the optical system 6), instead of being transmitted through lenses. Even with reflective optics, there are not many materials capable of reflecting EUV. In order to achieve reasonable reflectivities at near normal incidence (i.e., an incident beam landing on the surface of a mirror at an angle close to normal to the surface), the surface of a mirror is typically coated with multilayer, thin-film coatings. These multilayer, thin-film coatings reflect EUV in a phenomenon known as distributed Bragg reflection.

The multilayer coatings for the reflective surfaces in EUVL imaging system consist of a large number of alternating layers of materials having dissimilar EUV optical constants. These multilayers provide a resonant reflectivity when the period of the layers is approximately $\lambda/2$, where $\lambda$ is the wavelength. The most promising EUV multilayers are coatings of alternating layers of molybdenum (Mo) and silicon (Si). These layers are deposited with magnetron sputtering. Each layer of Mo or Si is coated to a thickness of $\lambda/4$ of the EUV light so that it will have a periodicity of $\lambda/2$. In this type of reflector, a small portion of the incident light is reflected from each silicon surface. The thickness of the layers causes the reflected light waves to interfere constructively. The more layers there are, the more light will be reflected. However, imperfections in the surface coating will eventually diminish the reflectivity return of more coatings. Currently, most mirrors in EUVL systems have around 40 alternating layer pairs of Mo:Si. Furthermore, most of these Mo:Si multilayers are optimized to function best with wavelengths at around 13.4 nm, which is the wavelength of a typical laser plasma light source.

Like the mirrors, the masks for EUVL application are reflective, not transmissive, because little EUV light would transmit through a mask. The reflective masks are manufactured of Mo:Si multilayers, much like the mirrors. However, the magnetron sputtering techniques used for the manufacturing of mirrors are not suitable for the masks because the defect rates with magnetron sputtering are too high to be used in making the masks. Instead, ion-beam sputtering, which has been shown to achieve several orders of magnitude less density of defects, is used to make the masks.

In the operation of an EUVL system, EUV light 24 is reflected off mask 4. The reflected light 47 is further reflected by mirrors (not shown) inside the optical system 6, which is used to direct and reduce the dimension of the reflected light 47. The reduction in dimension achieved by the optical system 6 allows a smaller image (than that on the mask 4) to be printed on wafer 7. Typically, such a printing process is performed in a step-and-scan mode, in which both mask 4 and wafer 7 need be moved in a precise and coordinated fashion. Such movement is made possible by placing mask (reticle) 4 and wafer 7 on movable stages 5 and 8, respectively, which are controlled by a computer (not shown). Stage 5 or 8 typically comprises an X-Y platen (a platen that can move in the X and Y directions) with a holder (not shown) to hold the mask 4 or the wafer 7. Movement of the stage is accomplished with motorized positioning devices that are controlled by a computer. These stages also facilitate the alignment of the components in the initial system setup.

In a projection lithographic system, precise alignment of the components (e.g., the mask, the mirrors, and the wafer) is critical for the production of an accurate pattern on the wafer substrate. The precision required for EUVL is more stringent than for optical lithography. These factors motivated the development of high-accuracy EUV wavefront measuring interferometry to determine the performance of an EUVL system at the operating wavelength or to align and adapt the system to the desired characteristics. For these purposes, easily adjustable components are essential. Having each component on an adjustable stage will facilitate such adjustment.

Whether during an alignment or scanning operation, the heavy mass of the stages impedes the accuracy and performance because the heavy mass requires more powerful motors which generate more heat. Heat causes the system temperature to rise and an EUVL system is highly sensitive to temperature changes. In addition, heavier mass hampers maneuverability of the system (i.e., difficult to achieve high precision control in the scanning operation). Therefore, in order to have easy maneuverability, hence improved positioning and scanning accuracy, it is desirable to have these components made of light-weight, stiff materials, or to use magnetic levitation to reduce the weights of the components. While magnetic levitation has been successfully used in the early development of EUVL systems, attention has now turned to the use of light-weight materials.

The use of light-weight materials for the construction of mirrors and optical components system components is not new, at least in the construction of mirrors. For example, Mary J. Edwards et al. describe methods of making light-weight mirrors in, "Current Fabrication Techniques for ULE™ and Fused Silica Light-weight Mirrors," V 3356, pp. 702–11, Proceedings of SPIE, Mar. 25–28, 1998. The methods involve machining out solid pieces of glass to produce a light-weight structure or fusing pieces of glass into a light-weight core. More recently, methods for making light-weight stages have also been reported. For example, Hrdina et al. in U.S. application Ser. No. 09/502,251, filed on Feb. 17, 2000, U.S. application Ser. No. 09/506,040, filed on Feb. 17, 2000 U.S. application Ser. No. 09/506,162, filed on Feb. 17, 2000, and U.S. Pat. No. 6,118,150, issued to Spence, disclosed a light-weight high stiffness stage platen. The platen disclosed in the Spence '150 patent was constructed of a thin plate and reinforced with a matrix of rib structures to give it the required stiffness.

In addition to minimizing the weight of components, an ideal EUVL system should also have good thermal response. That is, the system should not be sensitive to temperature changes. Therefore, it is desirable to have light-weight, low thermal expansion stages for use in EUVL systems.

SUMMARY OF INVENTION

One aspect of the invention relates to light-weight stages for use in EUVL systems. One embodiment comprises a platen having a top face and a bottom face and a holder for holding an optical component on the top face of the platen. The platen may comprise a light-weight material such as high purity fused silica or ultra low expansion glass. In other embodiments, the bottom face of the platen may further comprise means for connecting to a positioning device in an extreme ultraviolet lithography system.

Another aspect of the invention relates to methods for manufacturing light-weight EUVL stages. In one embodiment, a method for manufacturing an extreme ultraviolet lithography stage comprises extruding an included void structure from a glass material, and shaping the included void structure into the extreme ultraviolet lithography stage. The shaping may comprise fusing a thin piece of glass material onto the included void structure Another aspect of the invention relates to EUVL systems. In one embodiment, a lithographic projection system comprises a radiation system to supply a projection beam of radiation; a mask stage holding a mask, the mask stage being made of a light-weight material; a substrate stage holding a wafer, the substrate stage being made of the light-weight material; and an optic system for imaging an irradiated portion of the mask onto a target portion of the wafer. In another aspect, the glass material is preferably a $TiO_2$ containing silica glass, preferably a fused silica ultra low expansion glass, preferably with a $TiO_2$ content in the range of to 10 wt. % $TiO_2$, more preferably 6 to 8%, most preferably 6.5 to 7.5%.

Other aspects and advantages of the invention will be apparent from the accompanying descriptions and drawings.

DETAILED DESCRIPTION

Some embodiments of the invention relate to light-weight stages for use in an EUVL system. The step-and-scan operation of the mask and the wafer in an EUVL system becomes easier to manage when the overall weight of the stages is minimized.

Figure 2:
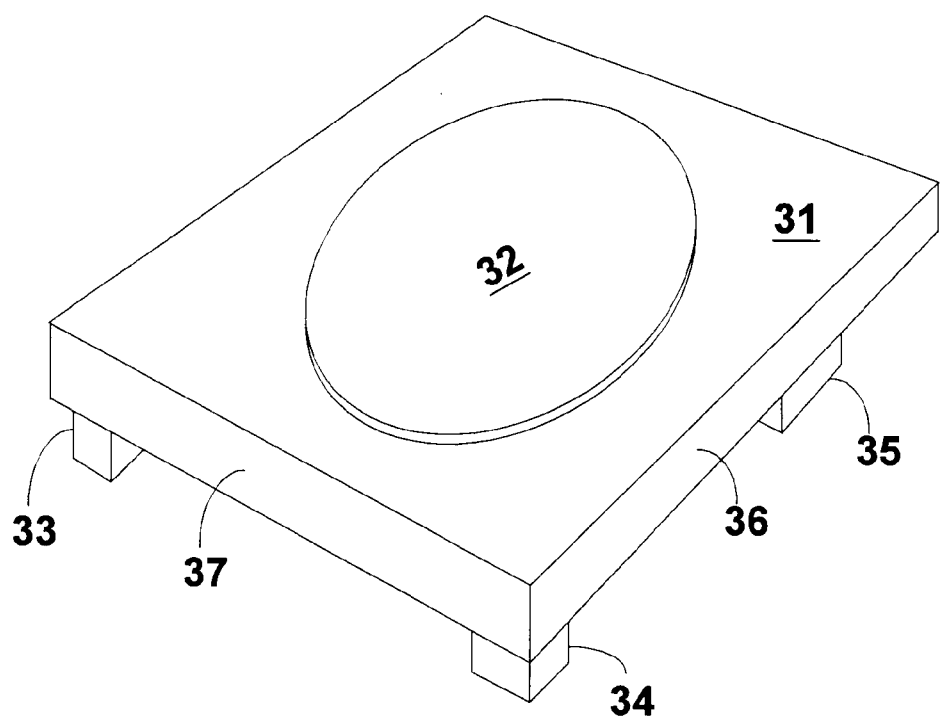
FIG. 2 is a diagram illustrating an EUVL stage according to one embodiment of the invention.

FIG. 2 illustrates one embodiment of a light-weight stage according to the invention. In this embodiment, the stage comprises a platen 31, a holder 32, and several accessory components (e.g., positioning actuators or motors) 33, 34, and 35.

The platen 31 is made of a light-weight material. The light-weight material may be glass or glass-ceramic. These materials may also have hollow included structures, such as honeycomb structures, to further reduce the weight. Because thermal expansion is detrimental to the precise operation of an EUVL system, it is preferred that these light-weight materials also have low coefficients of thermal expansion (CTE). Suitable light-weight, low CTE materials include high purity fused silica (such as a material sold under the trade name HPFS™ glass by Coming, Inc.) and ultra low expansion glass (such as a material sold under the trade name ULE™ glass by Coming, Inc.).

High purity fused silica (e.g., HPFS™ glass from Coming, Inc.) is a synthetic amorphous silicon dioxide glass manufactured by flame hydrolysis. The noncrystalline, colorless, silica glass has a very low thermal expansion coefficient. Ultra low expansion glass (e.g., ULE™ glass from Corning, Inc.) is a fused titanium silicate glass manufactured by flame hydrolysis and typically has an extremely low CTE (e.g., ±30 ppb/° C. over the temperature range of 5 to 35° C.). Ultra low expansion glass is distinct from other ultra low expansion materials in that it is a glass not a glass-ceramic; there are no crystalline structures within ultra low expansion glass. Which of these glasses to use will depend on the application. The ideal stages should have little or no expansion mismatch between the stage and the item (mask or wafer) it supports so as to minimize the stresses and distortions.

Platen 31 in this embodiment has a top face to which holder 32 is attached, a bottom face, and four side faces. Shown in FIG. 2 are two side faces 36 and 37. The side faces 36 and 37 may be polished so that they can be used to facilitate the alignment of the stages using an optical interferometer. Alternatively, polished plates (not shown) may be attached to side faces 36, 37 for the same purpose. The shape of the platen 31, though illustrated as a rectangle in FIG. 2, may be any suitable shape including, for example, polygons, square, oval, and circle. Furthermore, the top face and/or the bottom face of platen 31 may be flat or with some curvature.

Holder 32 as shown in FIG. 2 is for holding either a mask (on a mask stage) or a wafer (on a wafer stage). Holder 32 may hold a mask or a wafer using any of the mechanisms known in the art, including vacuum, mechanical, and electrostatic mechanisms. Among these, electrostatic devices, as shown in U.S. Pat. Nos. 5,221,403, 5,835,333, and 5,835,334, are preferred. Holder 32 may be in any shape suitable for holding a mask or a wafer; for example, it may be a disk in the shape of a circle, polygon, square (see 32 in FIG. 3A), or rectangle.

On the bottom face of the stage, there may be accessory components (e.g., motors or actuators) for positioning or moving the stages. For example, in FIG. 2, three such accessory components 33, 34 and 35 are shown. The number of accessory components will depend on the particular EUVL system. Any actuator devices known in the art for moving a platen may be used. These may include a linear or rotating motor, pneumatic, hydraulic, piezoelectric, and other types of electromagnetic devices. Instead of having these accessory components, the stage itself may include no accessory component. For example, it may provide attachment sites or means (see 43, 44, 45 in FIG. 3C) to connect to the positioning devices in an EUVL system.

Figure 3A:
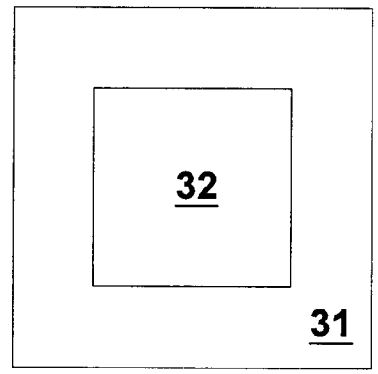
FIGS. 3A, 3B, and 3C are diagrams illustrating different views of an EUVL stage according to another embodiment of the invention.
Figure 3B:
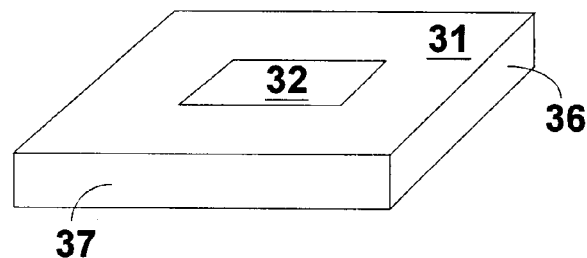
Figure 3C:
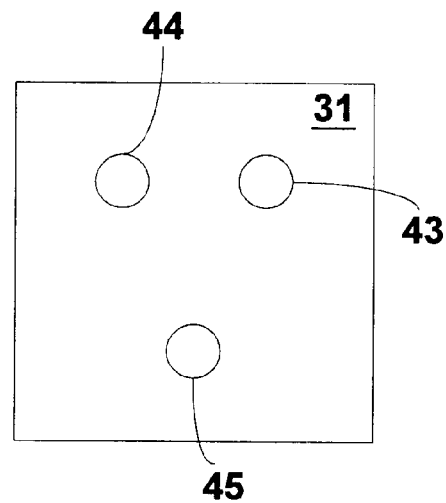

FIGS. 3A, 3B, and 3C illustrate different views of another embodiment of the invention. FIG. 3A shows a top view of the stage. In this illustration, both platen 31 and holder 32 are in square shapes. However, they can be in other shapes such as a circle, an oval, a rectangle, or a polygon. FIG. 3B shows an oblique view of the stage;

two side faces 36, 37 are visible in this view. These side faces may be polished and coated with a mirror surface to facilitate positioning and assembling of the stages using an interferometer. Alternatively, polished plates (not shown) may be attached to side faces 36 and 37 to achieve the same purpose. FIG. 3C shows a bottom face of the stage. Three attachment sites 43, 44, 45 are visible. These attachments sites may be used to connect to the positioning devices (motors or actuators) in an EUVL system.

As described above, the material for the embodiments of the invention may be a light-weight glass or glass-ceramic material. Furthermore, to afford better thermal management, these materials are preferably of low thermal expansion coefficient. Such light-weight, low thermal expansion materials may include high-purity fused silica (such as the HPFS™ glass from Coming, Inc.) and ultra low expansion glass (such as the ULE™ glass from Coming, Inc.). To further reduce the weight, these materials may be produced to have void included structures therein, one example of which is a honeycomb structure. A typical honeycomb structure may have an effective density of 50% to 98% less than that of an equivalent solid material.

Figure 4:
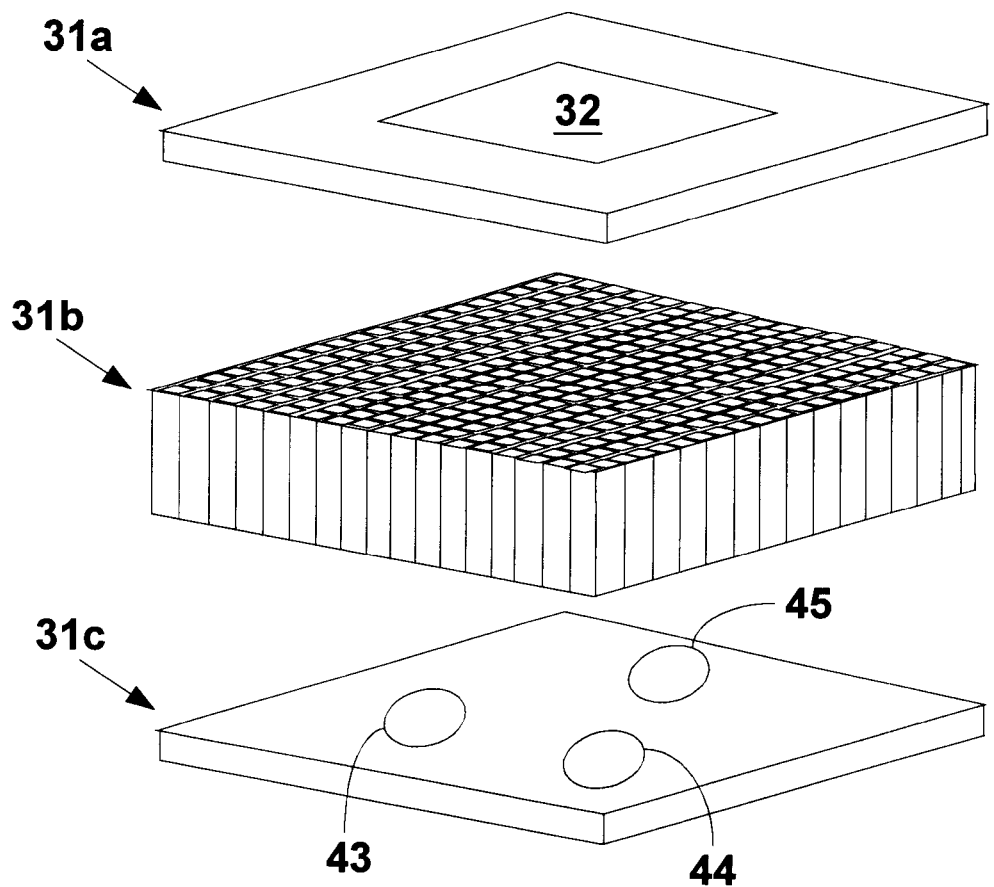
FIG. 4 is a diagram illustrating another EUVL stage according to one embodiment of the invention.

FIG. 4 illustrates one embodiment of the invention made of a honeycomb material. In this embodiment, the platen of the stage may comprise three parts 31a, 31b, and 31c. The top part 31a is a thin, solid piece and includes a holder 32. The middle part 31b is the main body of the stage and is comprised of a honeycomb substrate. Although in this illustration, the "channels" of the honeycomb structure are shown to go from the top face to the bottom face, this is not the only acceptable orientation. One skilled in the art would know that other orientations are acceptable without departing from the scope of the invention. The bottom part 31c is also a thin, solid piece and includes attachment sites or means 43, 44, 45 for connecting to positioning devices in an EUVL system. Three attachment sites/means are shown; however, it should be noted that there may be more or less attachment sites/means. The exact number of such sites and the mechanism for the attachment will be dictated by the positioning devices in the EUVL system. The top part 31a and the bottom part 31c may be assembled onto the main body 31b using any method known in the art suitable for the materials used. For example, if these parts are made of light-weight, low CTE glass such as the HPFS™ glass or ULE™ glass from Corning, Inc., the top and the bottom parts may be fused with the middle part using a low temperature fusion or frit fusion process. For example, U.S. Pat. No. 6,048,811 issued to the same assignee herein discloses a frit fusion process suitable for this process. This patent is herein incorporated by reference.

Some embodiments of the invention relate to methods for manufacturing light-weight stages for EUVL applications. The methods include shaping a light-weight material or a light-weight, low CTE material into an EUVL stage. Furthermore, the methods may include formation of honeycomb structures followed by formation (shaping) of the EUVL stages. Several methods known in the art are suitable for shaping a glass material into a desired configuration. These include machining, thermal fusion, and frit fusion. In machining, pieces from a starting material may be cut away or part of the starting piece ground away to produce the desired shape. For example, the above-mentioned paper by Edwards et al., "Current Fabrication Techniques for ULE™ and Fused Silica Light-Weight Mirrors," discloses methods for machining out solid piece of glass to produce a light-weight structure. With thermal fusion, pieces of glass materials are fused (joined) by applying thermal energy to melt the regions at the joint. In frit fusion, low-melting frits (powders) of a glass material are added to the joint to "glue" the pieces together when heated. For example, U.S. Pat. No. 6,048,811, which was assigned to the same assignee of the present invention, discloses a frit fusion process suitable for this process.

Several methods are available for the formation of void included structures, which may have voids in hexagon, square, triangle or other shapes. The void shapes refer to the shapes of cellular structures in the cross section of an included void structure. The methods for void inclusion formation include, for example, extrusion, casting, and fusion methods.

In an extrusion method, a starting material in the form of a paste (which is made from a powder starting material mixed with a suitable additive to make it plastic and flexible) is forced through a die (having a desired cellular structure) to produce a "green" "honeycomb," which is then fired at high temperature to produce a "mature" honeycomb. For example, U.S. Pat. No. 5,884,138, which was assigned to the same assignee of the present invention, discloses a method of extrusion suitable for this purpose.

In a casting method, a slurry of a starting material (e.g., titanium silicate glass) is poured into a mold. The structure thus formed is fired at high temperature to densify the structure and produce the final structure. In a fusion method, pieces (e.g., strips) of suitable materials (e.g., glass, glass-ceramic, or composite material) are fused with thermal treatment to form the cellular structures in the stage material. Particular shapes of cells in an included void structure are not important for the invention. These shapes may include triangular, square, rectangular, circular, hexagonal, or other polygonal shapes. Furthermore, the shapes of the cells need not be uniform, and a void structure may include a combination of different cellular structures.

After the formation of the included void structure, the piece may be shaped into an EUVL stage. The shaping processes may include machining the structure (see e.g., FIG. 4). Several machining processes are known in the art and are applicable to the invention. For example, U.S. Pat. No. 5,487,694, which was assigned to the same assignee of the present invention, discloses a method for shaping included void substrates. This patent is herein incorporated by reference. The glass materials may also be shaped into a desired structure by other means which may include adher ing or sealing of these glass structures to a solid sheets of glass. Fusing the glass material is typically accomplished at high temperature and sealing the glass material using frits typically involves using low-melting "frits" of glass to thermally fuse Coin) two pieces of glass material.

Figure 1:
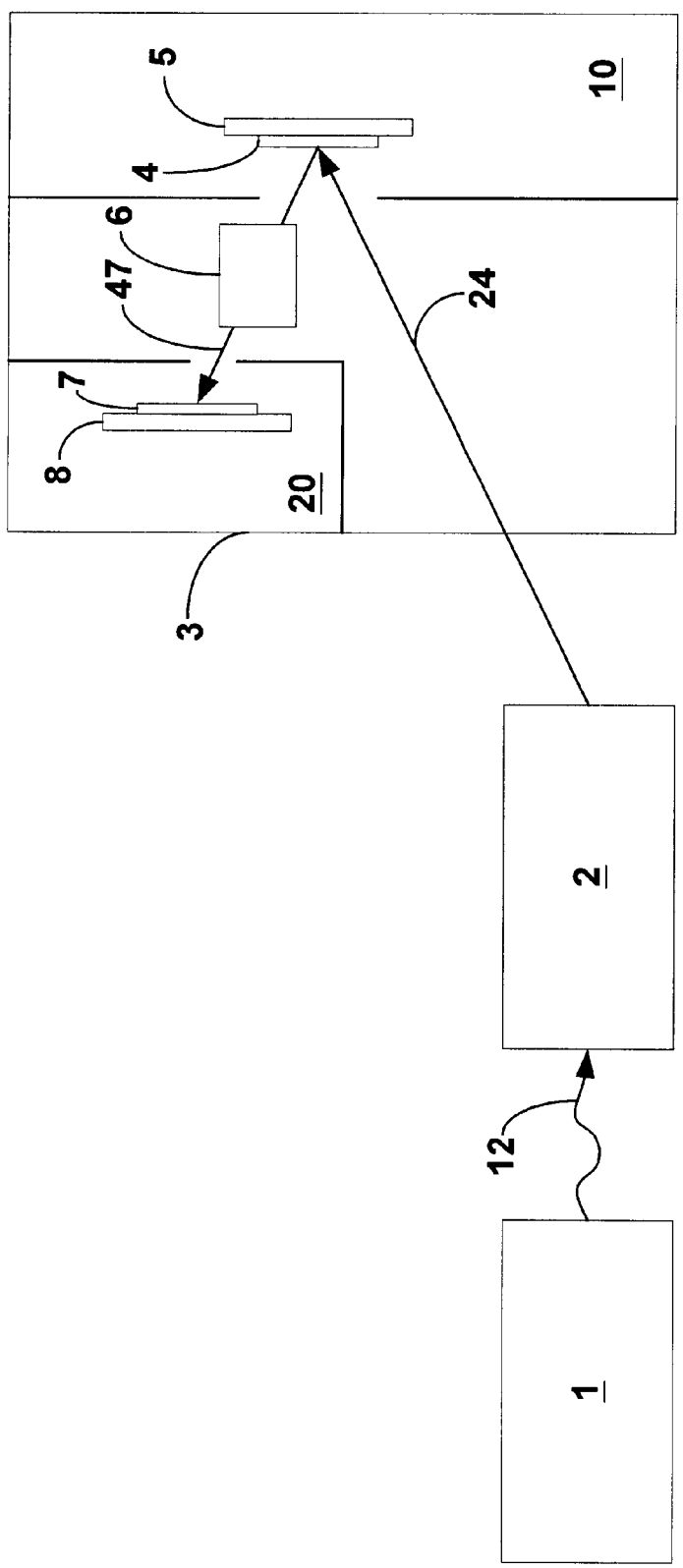
FIG. 1 is a diagram of a prior art EUVL system.

Some embodiments of the invention relate to systems or apparatus for EUV lithography. Embodiments of the invention may look like the schematic shown in FIG. 1, except that the stages (the mask stage and the wafer stage) in such a system are made of a light-weight material. In one embodiment, the system includes a radiation system to supply a projection beam of radiation, a mask stage to hold a mask, a wafer stage to hold a wafer, and a projection system (or camera) to image an irradiated portion of the mask onto a target portion of the wafer. The radiation system comprises a light source and a condenser (for example, 1 and 2, respectively, in FIG. 1). A number of EUV light sources are currently available. These include laser-produced plasmas, radiation from the bending magnets and the undulators associated with synchrotrons, and radiation from electron discharge. A commonly used light source for EUVL is that from a laser-produced plasma, in particular that with a wavelength of 13.4 nm.

The optical system (camera) in various embodiments of the invention may comprise several mirrors. Any camera systems known in the art for EUVL application may be used. These include two-mirror cameras, four-mirror cameras (e.g. a four-mirror ring-field camera), and six-mirror cameras. Both the mask stage and the wafer stage in these embodiments are made of a light-weight and/or low CTE material, preferably having an included void structure.

While the invention has been described using a limited number of embodiments, those skilled in the art, having the benefit of this disclosure, will appreciate that other variations are possible without departing from the scope of the invention as disclosed herein. Accordingly, the scope of the invention should be limited only by the attached claims.

What is claimed is:

1. A lithographic projection system comprising:
   a radiation system to supply a projection beam of radiation;
   a mask stage holding a mask, the mask stage being made of an ultra low expansion glass, said glass a nonglass-ceramic noncrystalline silica glass with a $TiO_2$ content in the range of 6 to 8 wt. % $TiO_2$ and a coefficient of thermal expansion of ±30 ppb/° C. over a temperature range of 5 to 35° C.;
   a substrate stage holding a wafer, the substrate stage being made of said ultra low expansion glass; and
   an optic system for imaging an irradiated portion of the mask onto a target portion of the wafer.

2. The lithographic system of claim 1, wherein said silica glass has a $TiO_2$ content of 6.5 to 7.5 wt. % $TiO_2$.

3. A lithographic projection system comprising:
   means for supplying a projection beam of radiation;
   a mask stage holding a mask, the mask stage being made of an ultra low expansion glass, said glass a nonglass-ceramic noncrystalline silica glass with a $TiO_2$ content in the range of 6 to 8 wt. % $TiO_2$ and a coefficient of thermal expansion of ±30 ppb/° C. over a temperature range of 5 to 35° C.;
   a substrate stage holding a wafer, the substrate stage being made of said ultra low expansion glass; and
   means for imaging an irradiated portion of the mask onto a target portion of the wafer.

4. A lithographic stage, comprising:
   a platen made of an ultra low expansion glass, said glass a nonglass-ceramic noncrystalline silica glass with a $TiO_2$ content in the range of 6 to 8 wt. % $TiO_2$ and a coefficient of thermal expansion of ±30 ppb/° C. over a temperature range of 5 to 35° C.; and
   means for holding an optical component on the platen.

5. The lithographic stage of claim 4, wherein said silica glass has a $TiO_2$ content of 6.5 to 7.5 wt. % $TiO_2$.

6. The lithographic stage of claim 4, wherein the optical component comprises one selected from a mask and a wafer.

7. The lithographic stage of claim 4, further comprising an accessory component on a bottom face thereof.

8. The lithographic stage of claim 4, further comprising means for connecting the platen to a positioning device.

9. A lithographic stage, comprising:
   a platen made of an ultra low expansion glass, said glass a nonglass-ceramic noncrystalline silica glass with a $TiO_2$ content in the range of 6 to 8 wt. % $TiO_2$ and a coefficient of thermal expansion of ±30 ppb/° C. over a temperature range of 5 to 35° C.; and
   a holder for holding an optical component on the platen.

10. A method for manufacturing an extreme ultraviolet lithography stage, comprising:
    extruding a structure from a glass material, said glass material comprising a $TiO_2$ containing silica ultra low expansion glass, with said structure having a plurality of voids; and
    shaping the structure into the extreme ultraviolet lithography stage.

11. The method of claim 10, wherein the extreme ultraviolet lithography stage is one selected from a mask stage and a wafer stage.

12. The method of claim 10, wherein the glass material has a $TiO_2$ content in the range of 5 to 10 wt. % $TiO_2$.

13. The method of claim 10, wherein the shaping comprises fusing a piece of $TiO_2$ containing silica ultra low expansion glass onto the extruded structure.

* * * * *